United States Patent
Larson

(10) Patent No.: US 7,321,260 B2
(45) Date of Patent: Jan. 22, 2008

(54) PING-PONG AUTO-ZERO AMPLIFIER WITH GLITCH REDUCTION

(75) Inventor: Mark R. Larson, Maple Grove, MN (US)

(73) Assignee: Honeywell International, Inc., Morristown, NJ (US)

( * ) Notice: Subject to any disclaimer, the term of this patent is extended or adjusted under 35 U.S.C. 154(b) by 112 days.

(21) Appl. No.: 11/369,384

(22) Filed: Mar. 7, 2006

(65) Prior Publication Data

US 2007/0222505 A1    Sep. 27, 2007

(51) Int. Cl.
*H03F 1/02* (2006.01)
(52) U.S. Cl. ............................................ 330/9; 330/51
(58) Field of Classification Search .................... 330/9, 330/51; 327/124
See application file for complete search history.

(56) References Cited

U.S. PATENT DOCUMENTS

| 3,801,919 | A | 4/1974 | Wilkes et al. ................. 330/9 |
| 4,190,805 | A | 2/1980 | Bingham ....................... 330/9 |
| 4,829,263 | A | 5/1989 | Gulczynski .................... 330/9 |
| 6,476,671 | B1 | 11/2002 | Tang ............................... 330/9 |
| 6,498,530 | B1 | 12/2002 | Tang |
| 2007/0001758 | A1* | 1/2007 | Alexander et al. ............ 330/69 |

FOREIGN PATENT DOCUMENTS

GB          2 149 248 A      6/1985

OTHER PUBLICATIONS

International Search Report for PCT/US2006/046363 mailed May 5, 2007.
Opris, Ion E., et al., "A Rail-To-Rail Ping-Pong Op-Amp," IEEE Journal of Solid State Circuits, vol. 31, No. 9, Sep. 1996, pp. 1320-1324).

* cited by examiner

*Primary Examiner*—Robert Pascal
*Assistant Examiner*—Hieu Nguyen
(74) *Attorney, Agent, or Firm*—McDonnell Boehnen Hulbert & Berghoff LLP

(57) ABSTRACT

A ping-pong amplifier with reduced glitching is described. The ping-pong amplifier includes a nulling amplifier coupled to a switching network. The switching network is used to auto-zero a ping amplifier within a ping-pong amplifier. The nulling amplifier drives the output of a ping amplifier to a proper output voltage level during auto-zeroing of the ping amplifier. By being at a proper output voltage level, glitches associated with transitioning between a ping amplifier and a pong amplifier are reduced or eliminated.

20 Claims, 3 Drawing Sheets

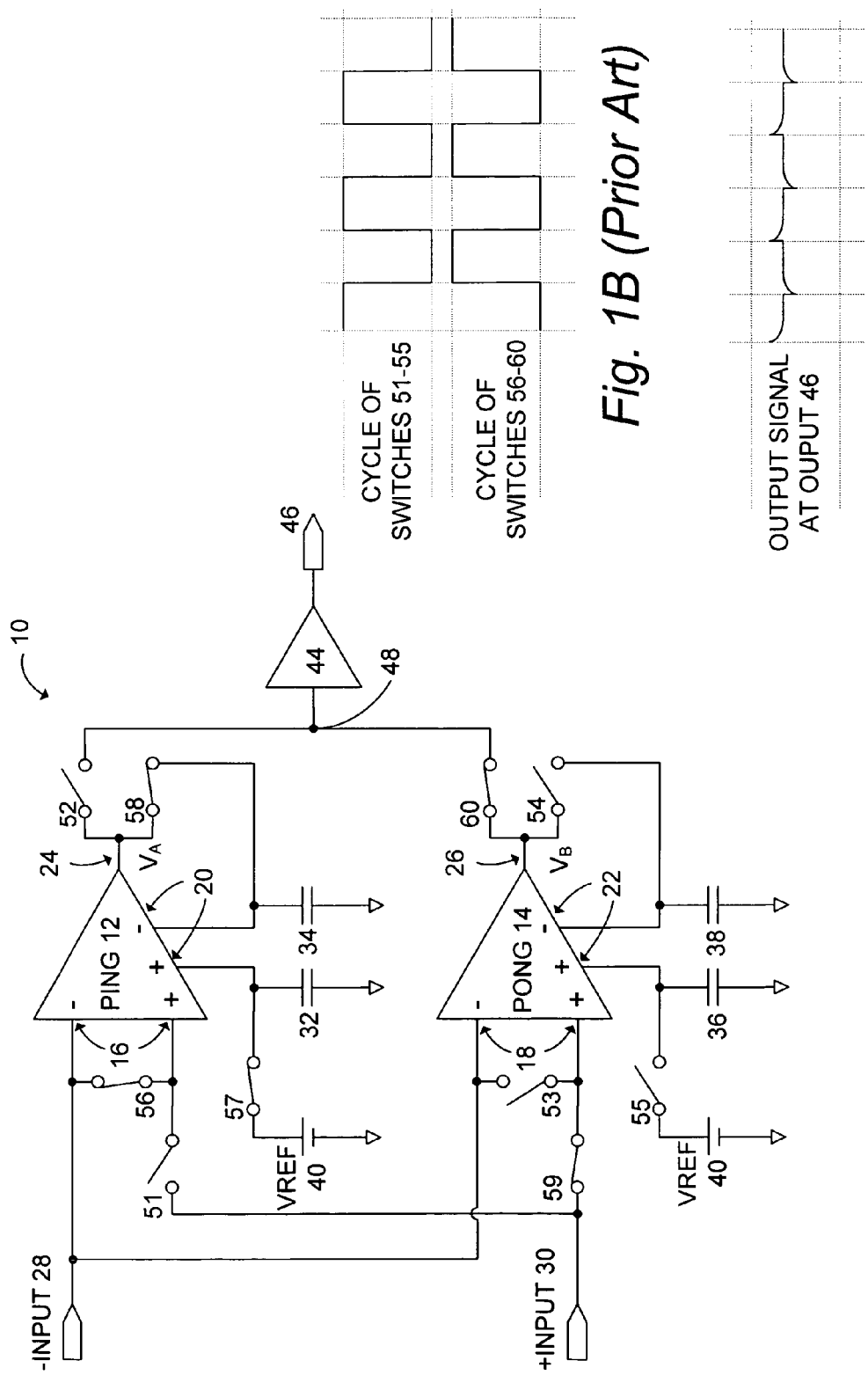

PING-PONG AUTO-ZERO AMPLIFIER WITH GLITCH REDUCTION

GOVERNMENT RIGHTS

The United States Government has acquired certain rights in this invention pursuant to Contract No. DE-FC26-03NT41834 with the Department of Energy.

FIELD

The present invention relates generally to the field of ping-pong amplifiers, and more particularly to a ping-pong amplifier with glitch reduction.

BACKGROUND

Circuits used for signal conditioning in extreme environments, such as High-Temperature High Pressure (HTHP) wells in the down-hole oil exploration industry, often have stringent operating requirements. These requirements arise from the fact that these extreme environments affect the performance characteristics of such circuits. For example, in the down-hole oil exploration industry, temperatures may range from −55° C. to 225° C. High temperatures in particular can have serious detrimental effects on circuit performance.

Generally, in signal conditioning systems such as HTHP, an amplifier is used to buffer high-impedance sensor (DC-coupled) outputs. In extreme environments, performance characteristics such as input offset current, offset voltage, and low-frequency noise response are important considerations for such an amplifier. The materials and processing methods used to fabricate an amplifier directly determine performance characteristics. For example, Silicon-On-Insulator (SOI) CMOS substrates and SOI CMOS processing techniques have been shown to yield amplifiers with reduced leakage currents and other enhanced characteristics (e.g., reduced device latch-up).

Despite the advantages of using SOI CMOS, issues related to input offset voltage (and current) and low 1/f noise for DC/low-frequency amplifier applications have not been fully addressed. Consequently, ping-pong auto-zeroed amplifiers have been developed to address these issues. These amplifiers produce a low input offset voltage and low 1/f noise by an auto-zeroing process. The auto-zeroing process periodically alternates, or "ping-pongs," between a ping amplifier and a pong amplifier. When a ping amplifier is providing amplification, the pong amplifier corrects itself for input offset voltage, or "auto-zeroes." After a predetermined time, the pong amplifier provides amplification and the ping amplifier auto-zeroes.

A Basic Ping-Pong Amplifier (BPPA) 10 is illustrated in FIG. 1A. BPPA 10 includes two matched amplifiers 12 and 14. Amplifiers 12 (PING AMP) and 14 (PONG AMP) may be viewed as the primary amplifiers of BPPA 10. PING AMP 12 and PONG AMP 14 each respectively include a pair of primary differential inputs 16 and 18, an auxiliary pair of differential inputs 20 and 22, and single-ended outputs 24 and 26. The primary inputs 16 and 18 are each switchably coupled to −Input 28 and +Input 30 (which receive an externally applied differential input signal). The auxiliary differential inputs 20 and 22 receive offset voltage correction signals. Single-ended outputs 24 and 26 are coupled to output stage 44 to produce a BPPA 10 output signal at node 46.

Also included in BPPA 10 are switches 51-60. Switches 51-60 form a switching network which is used to couple −Input 28 and +Input 30 to PING AMP 12 and PONG AMP 14, VREF 40 to one side of differential auxiliary inputs 20 and 22, and outputs 24 and 26 to output stage 44. Switches 51-60 are controlled by a two-phase non-overlapping clock (not shown). Switches 51-55 are switched by one phase of the clock and switches 56-60 are switched by the other phase of the clock. A transmission gate may be used to implement switches 51-60. An example timing diagram of a two-phase non-overlapping clock signal used to open and close switches 51-60 is illustrated in FIG. 1B.

As described above, PING AMP 12 and PONG AMP 14 alternately drive output stage 44 (by amplifying the externally applied differential signal) or are being auto-zeroed. If PING AMP 12 is being auto-zeroed, for example, switches 56-58 are closed and switch 52 is open, thereby preventing PING AMP 12 and PONG AMP 14 from shorting together. During this time, output 24 is nulled to a voltage $V_A$. $V_A$ may be roughly calculated to be:

$$V_A \approx (gm_A 1/gm_A 2) * Vos_A + VREF40$$

where $gm_A 1$ and $gm_A 2$ are the respective transconductances of the primary differential pair (coupled to inputs 16) and the auxiliary differential pair (coupled to inputs 20) within PING AMP 12. $Vos_A$ is an input offset voltage intrinsic to PING AMP 12. A correction voltage to compensate for $Vos_A$ is forced onto capacitors 32, 34, and auxiliary differential input 20 when switches 57 and 58 are closed (PING AMP 12 auto-zeroing). When 57 and 58 are opened at the end of the PING AMP 12 auto-zero phase, capacitors 32 and 34 store the correction voltage and communicate it to input 20 during the PING AMP 12 amplification phase. $Vos_A$ is thus nulled out.

Similarly, when PONG AMP 14 is auto-zeroed, output 26 is nulled to a voltage $V_B$. $V_B$ may be roughly calculated to be:

$$V_B \approx (gm_B 1/gm_B 2) * Vos_B + VREF40$$

where $gm_B 1$ and $gm_B 2$ are the respective transconductances of the primary differential pair coupled to inputs 18 and the auxiliary differential pair coupled to auxiliary inputs 22. Analogous to PING AMP 12, an offset correction voltage is also stored (during auto-zeroing) and communicated (during amplification) via capacitors 36 and 38.

By periodically ping-ponging between PING AMP 12 and PONG AMP 14, capacitors 32-38 are refreshed and the overall amplifier remains auto-zeroed. In HTHP applications this may be done at a predetermined frequency so that if capacitors 32-38 and other circuit components within BPPA 10 dissipate in charge or drift in value, frequent refreshing assures an accurate offset voltage correction of PING AMP 12 and PONG AMP 14 will be maintained.

While basic ping-pong amplifiers provide a substantial reduction in input offset voltage, the output signal at node 46 may be impacted by transient glitches attributable to ping-ponging between PING AMP 12 and PONG AMP 14. For example, the voltage level used to drive output stage 44 (at node 48) may be generally around the voltage level of VREF 40. However, when PONG 12 is initially switched (via switch 52) to drive output stage 44, a transient voltage difference (or glitch) of about $(gm_A 1/gm_A 2) * Vos_A$ will be communicated to node 48. Likewise, when PONG AMP 14 is initially switched (via switch 60) to node 48, a transient voltage difference of about $(gm_B 1/gm_B 2) * Vos_B$ will be communicated to node 48. As the system adjusts and corrects for these error terms, exaggerated transient glitches at node 46 are produced.

The residual voltage difference from what is required at node 48 is ultimately corrected by feedback from external resistors that set the overall ping-pong amplifier closed-loop gain. Feedback will adjust the differential voltages at differential inputs 16 or 18 to what is needed to correctly position node 48. This correction in effect produces a small input offset error in PING 12 and PONG 14, owing to their finite voltage gain. The offset error generally differs between PING 12 and PONG 14, which introduces the undesirable effect of an offset voltage "square wave" as the system ping-pongs between PING 12 and PONG 14. This "square wave" will be amplified by the closed-loop gain of the overall ping-pong amplifier and appears at output node 46. The edges of the square wave will generally have exaggerated transient overshoot glitches, similar to the effect shown in FIG. 1C. Additionally, the transient glitch magnitude may be further exacerbated by charge injection effects from switches 51-60.

These transient glitches and "square wave" effect may be problematic to downstream circuits that receive them. Therefore, there is a need for a ping-pong amplifier with improved auto-zeroing.

SUMMARY

A ping-pong auto-zeroed amplifier with reduced glitching is presented. The ping-pong amplifier includes a ping amplifier, a pong amplifier, a nulling amplifier, and a switching network. This approach seeks to minimize movement of internal circuit nodes during "ping-ponging" that would otherwise contribute to transient glitching phenomenon typically associated with ping-pong amplifiers.

During the auto-zero phase of the ping amplifier, the switching network couples the nulling amplifier output to an auxiliary differential input of the ping amplifier. Additionally, the switching network couples the ping amplifier output to a first differential input of the nulling amplifier. The output of a pong amplifier (equivalent to the input of the output stage) is coupled to a second differential input of the nulling amplifier As a result, the output voltage of the ping amplifier tracks, and is nulled to, the voltage level at the input of the output stage, thereby reducing or eliminating glitching during a transition, or "ping-pong," from the ping amplifier to the pong amplifier.

In the auto-zero phase of the pong amplifier, a second nulling amplifier may be used to auto-zero the pong amplifier. When the pong amplifier is being auto-zeroed, its output along with the output of the ping amplifier (equivalent to the input of the output stage) is communicated to differential inputs of the second nulling amplifier. Analogously to the ping amplifier auto-zero process described above, the second nulling amplifier drives the output of the pong amplifier to the output voltage level of the ping amplifier.

Capacitors coupled to the auxiliary differential inputs of the ping and pong amplifiers may be used to store an offset correction voltage. This offset correction voltage reduces or eliminates any intrinsic offset voltage in the ping or pong amplifiers. Additionally, a capacitance may be coupled between the output of a nulling amplifier and its inverting input. This capacitance may be used as an integrator capacitor to improve a.c. characteristics (stability) of the auto-zero feedback loop. The capacitance may also be used to store a voltage in order to "pre-charge" a nulling amplifier to its approximate auto-zero equilibrium level, thus further reducing transient glitch tendencies.

These as well as other aspects and advantages will become apparent to those of ordinary skill in the art by reading the following detailed description, with reference where appropriate to the accompanying drawings. Further, it is understood that this summary is merely an example and is not intended to limit the scope of the claims.

BRIEF DESCRIPTION OF THE DRAWINGS

Certain examples are described below in conjunction with the appended drawing figures, wherein like reference numerals refer to like elements in the various figures, and wherein:

FIG. 1A is a circuit diagram of ping-pong amplifier;

FIG. 1B is a timing diagram of clock signals used to cycle a switching network of the ping-pong amplifier of FIG. 1A;

FIG. 1C is a timing diagram illustrating glitching that results from "ping-ponging" between the ping and pong amplifiers of FIG. 1A;

DETAILED DESCRIPTION

A ping-pong auto-zeroed amplifier with reduced glitching operates in a similar manner as a Basic Ping-Pong Amplifier (BPPA). However, the ping-pong amplifier with reduced glitching includes a nulling amplifier which smoothes a transition, or ping-pong, from a ping amplifier to a pong amplifier and vice-versa, and improves auto-zeroing accuracy.

Figures 2A, 2B:
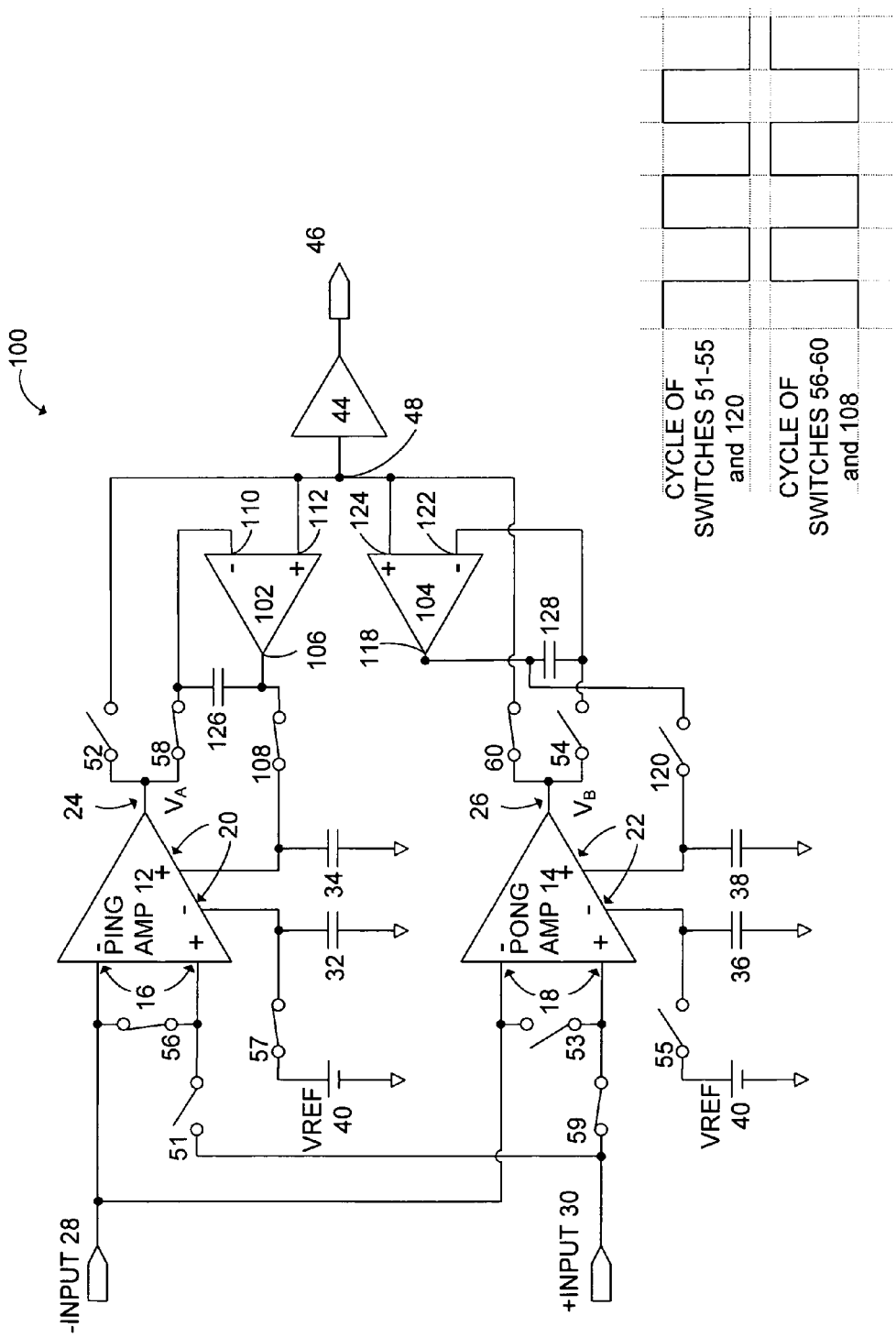
FIG. 2A is a circuit diagram of a ping-pong amplifier with glitch reduction.
FIG. 2B is a timing diagram of clock signals used to cycle the switching network of the ping-pong amplifier of FIG. 2A.

Turning now to FIG. 2A, a ping-pong auto-zeroed amplifier 100 with reduced glitching is illustrated. Ping-pong amplifier 100 includes all of the elements of BPPA 10 (see FIG. 1A). In other examples, however, not all of the elements of BPPA 10 need to be included. For example, a different arrangement of switches 51-60 may be used to create a switching network for ping-pong amplifier 100. It should be understood that a wide variety of ping-pong amplifiers may be compatible with the devices and methods for reduced glitching as presented in this disclosure.

In addition to including elements of BPPA 10, ping-pong amplifier 100 also includes nulling amplifiers 102 and 104. Nulling amplifier 102 has a single-ended output 106 coupled to a switch 108, a differential input 110 coupled to switch 58, and a differential input 112 coupled to node 48. Nulling amplifier 104 has a single-ended output 118 coupled to a switch 120, a differential input 122 coupled to switch 54, and a differential input 124 coupled to node 48.

Also shown in FIG. 2A, outputs 106 and 118 are respectively coupled to inputs 110 and 122 by capacitors 126 and 128. In alternative examples, however, other types of circuitry may be used to couple these outputs to a respective input. Such examples will be further described with reference to FIGS. 3B and 3C.

During normal operation, ping-pong amplifier 100 ping-pongs between PING AMP 12 and PONG AMP 14 in a similar manner to that of BPPA 10. However, ping-pong amplifier 100 provides glitch reduction by using nulling amplifiers 102 and 104 to null outputs 24 and 26 to the voltage level of node 48 prior to switch-over from auto-zero phase to amplification phase.

Figure 3B:
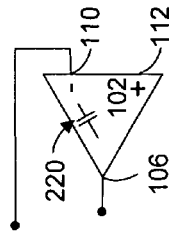
FIG. 3B is a circuit diagram of a nulling amplifier with an intrinsic capacitance.
Figure 3C:
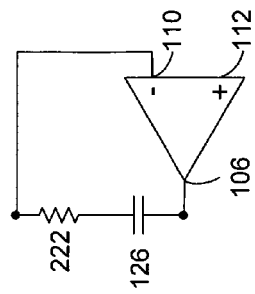
FIG. 3C is a circuit diagram of a nulling amplifier having an input and an output coupled to a capacitor and a resistor.
Figure 3A:
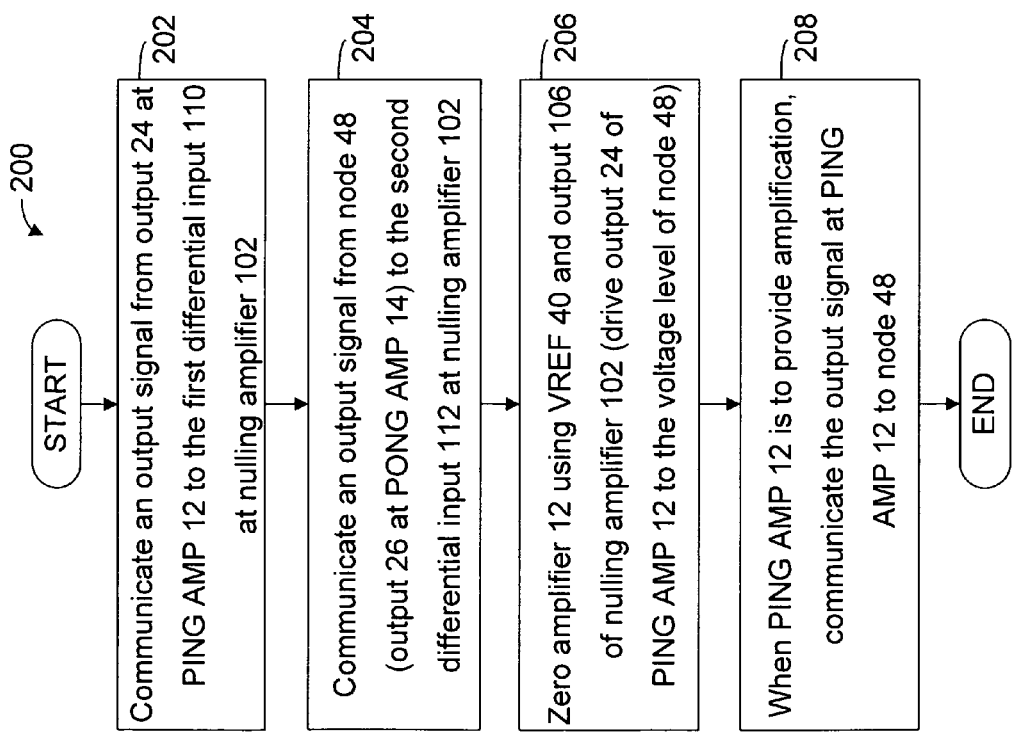
FIG. 3A is a method of operating the ping-pong amplifier of FIG. 2A.

Method 200, illustrated in the flow diagram of FIG. 3A, further describes how nulling amplifier 102 reduces glitching in ping-pong amplifier 100. At block 202, a signal (ping) from output 24 of PING AMP 12 is communicated to input 110 (when switch 58 closes). A signal (pre-output) at node 48 is then communicated to input 112, as shown at block 204. The pre-output signal is also communicated to output stage 44. Additionally, the pre-output signal is equal to an output signal (pong) from PONG AMP 14 which is communicated from output 26. In effect, output 26 is directly coupled to input 112 when switch 60 closes.

At block 206, PING AMP 12 is zeroed using a reference signal from VREF 40 and a nulling signal from output 106 at nulling amp 102. The reference and nulling signals are communicated to auxiliary inputs 20 which are used to zero PING AMP 12. Instead of communicating the ping signal directly to an auxiliary input, however, as is done in BPPA 10 of FIG. 1A, the ping signal is driven to the voltage level of node 48. The offset voltage contribution to the ping signal, as described with reference to FIG. 1A, is therefore reduced or eliminated. Concurrently with the ping output signal being corrected, PING AMP 12 is also auto-zeroed, albeit using the nulling signal in lieu of the ping output signal. Additionally, as described above, an input offset voltage correction signal is subsequently stored on capacitors 32 and 34.

When PING AMP 12 is to provide amplification for ping-pong amplifier 100, as shown at block 208, a ping output signal that matches the voltage level at node 48 is provided to output stage 44. Because the ping output signal has a reduced or eliminated error voltage contribution, the glitch that occurs when transitioning from PING AMP 12 to PONG AMP 14 is reduced or eliminated. In a similar manner, PONG AMP 14 may use nulling amplifier 104 to produce a ~glitch-free pong signal.

As described above, capacitors 126 and 128 are used to couple together the output and inverting input of nulling amplifiers 102 and 104. The capacitive coupling may provide a two-fold benefit. First, capacitors 126 and 128 may be used as an integrator capacitance. In this manner, capacitors 126 and 128 help to stabilize the ping and pong auto-zero loops (prevent oscillations) during auto-zeroing.

A second benefit to including capacitors 126 and 128 is that they may be used to store a voltage value associated with the equilibrium auto-zero state. Storing this voltage in effect pre-charges nulling amplifiers 102 and 104 to their auto-zero equilibrium levels. For example, when PING AMP 12 transitions from auto-zero to amplification, capacitor 126 stores the voltage value associated with PING AMP 12's auto-zero loop equilibrium state, and in effect holds nulling amplifier 102 in this state while PING AMP 12 is in its amplification phase. When PING AMP 12 transitions back to auto-zero in the next cycle, there will be minimal circuit node disturbance since null amp 102 "remembers" the voltage it provided to auto-zero PING AMP 12. The benefits of this are fast refresh/settling time of the auto-zero loop and a further reduction of glitching at output node 46, owing to minimal internal circuit node disturbance.

Although capacitors 126 and 128 are shown in FIG. 2A, it should be understood that ping-pong amplifier 100 is not limited to include these capacitors. Depending on the choice of amplifier and other circuit components, no capacitors may be used or a capacitive contribution that is inherent to the ping-pong amplifier 100 may be used to provide a desired capacitance. As shown in FIG. 3B, a capacitance 220 may be intrinsic to nulling amplifier 102, for example. Alternatively, as shown in FIG. 3C, other circuit elements such as resistor 222 may be added in series with capacitors 126 and 128 to adjust a phase lead or a lag time associated with the auto-zero loop of ping-pong amplifier 100.

An additional feature of ping-pong amplifier 100 is that it reduces sensitivity to noise, drift and droop present at auxiliary inputs 20 and 22. This is primarily due to the fact that the transconductance ratio (gm1/gm2) of the primary and auxiliary differential pairs within PING AMP 12 and PONG AMP 14 can be made quite large. The transconductance of the auxiliary differential pair, gm2, can be made quite small in comparison to gm1, the transconductance of the primary differential pair. Increasing this transconductance ratio reduces the sensitivity of the primary differential pair to changes on the auxiliary differential pair.

The presented ping-pong amplifier reduces or eliminates glitches associated with ping-ponging from a ping amplifier to a pong amplifier. In particular, the ping-pong amplifier includes a nulling amplifier coupled to a switching network. When a ping amplifier is to be auto-zeroed, the nulling amplifier uses a pre-output signal (the output from the pong amplifier) along with the output of the ping amplifier to drive the output of the ping amplifier to the voltage level of the pre-output signal. An output of the nulling amplifier is also used to provide a nulling signal that may be used for auto-zeroing the ping amplifier.

It should be understood that the illustrated examples are examples only and should not be taken as limiting the scope of the present invention. For example, the nulling signal as described above may be supplied to a variety of different types of ping and pong amplifiers and not exclusively to the described ping and pong amplifiers. It should also be understood that the nulling amplifier may be coupled to a variety of ping-pong amplifiers so that glitch-free ping-ponging is achieved. In addition, the claims should not be read as limited to the described order or elements unless stated to that effect. Therefore, all examples that come within the scope and spirit of the following claims and equivalents thereto are claimed as the invention.

I claim:

1. A ping-pong auto-zero amplifier, comprising:
    a first nulling amplifier having first and second differential inputs and a single-ended output, the first input coupled to receive a pre-output signal of the ping-pong amplifier; and
    a switching network for auto-zeroing a ping amplifier within the ping-pong amplifier, the switching network providing during the auto-zeroing:
        i) a coupling of the output of the nulling amplifier to a first auxiliary differential input of the ping amplifier; and
        ii) a coupling of the second input of the first nulling amplifier to a single-ended output of the ping amplifier.

2. The ping-pong amplifier as in claim 1, further comprising a capacitance coupled between the output of the first nulling amplifier and the second input of the first nulling amplifier.

3. The ping-pong amplifier as in claim 2, wherein the capacitance is an intrinsic capacitance of the first nulling amplifier.

4. The ping-pong amplifier as in claim 2, further comprising a resistance coupled in series with a capacitance between the output of the first nulling amplifier and the second input of the first nulling amplifier.

5. The ping-pong amplifier as in claim 1, wherein the output signal is communicated to an output stage for providing communications to external circuitry.

6. The ping-pong amplifier as in claim 1, wherein during the auto-zeroing of the ping amplifier, the switching network provides a coupling of a reference bias to a second auxiliary differential input of the ping amplifier.

7. The ping-pong amplifier as in claim 6, wherein the first auxiliary input is coupled to a first capacitor and the second auxiliary input is coupled to a second capacitor.

8. The ping-pong amplifier as in claim 7, wherein during the auto-zeroing of the first ping amplifier, the switching network couples together first and second primary differential inputs of the ping amplifier.

9. The ping-pong amplifier as in claim 1, further comprising:
 a second nulling amplifier having first and second differential inputs and a single-ended output, the first input of the second nulling amplifier coupled to receive the pre-output signal of the ping-pong amplifier; and
 a capacitance coupled between the output of the second nulling amplifier and the second differential input of the second nulling amplifier.

10. The ping-pong amplifier as in claim 9, wherein during the auto-zeroing of the first nulling amplifier, the switching network provides a coupling of a single-ended output of a pong amplifier associated with the ping-pong amplifier to the first input of the second nulling amplifier.

11. A method of operating a ping-pong auto-zero amplifier, the method comprising:
 providing a first output signal from a ping amplifier to a first differential input of a first nulling amplifier;
 providing a second output signal of a pong amplifier to a second differential input of the first nulling amplifier; and
 auto-zeroing an offset voltage associated with the ping amplifier using a reference signal and a third signal communicated from an output of the first nulling amplifier, thereby driving the first output signal to a voltage level of the second output signal.

12. The method as in claim 11, further comprising storing a voltage associated with the first output signal on a capacitor coupled between the output of the first nulling amplifier and the first input of the first nulling amplifier.

13. The method as in claim 11, further comprising:
 communicating the second output signal to an input of an output stage; and
 generating a fourth output signal at an output of the output stage.

14. The method as in claim 11, further comprising storing an offset correction voltage across first and second capacitors respectively coupled to first and second auxiliary differential inputs of the ping amplifier.

15. The method as in claim 11, further comprising communicating the second output signal to a first differential input of a second nulling amplifier.

16. The method as in claim 15, further comprising:
 switching a switching network coupled to the ping and pong amplifiers and the first and second nulling amplifiers so that the first output signal is provided to the first differential input of the second nulling amplifier and so that the second output signal is communicated to a second differential input of the second nulling amplifier; and
 auto-zeroing an offset voltage associated with the pong amplifier using the reference signal and a fourth signal communicated from an output of the second nulling amplifier.

17. The method as in claim 16, wherein the second output signal is not communicated to the first input of the first nulling amplifier.

18. A ping-pong auto-zeroed amplifier, comprising:
 first and second primary amplifiers, each comprising:
  first and second primary differential inputs;
  first and second auxiliary differential inputs; and
  a single-ended output;
 first and second nulling amplifiers comprising:
  first and second differential inputs; and
  a single-ended output;
 a switching network that provides at a first time:
  i) a coupling of the output of the first nulling amplifier to the first auxiliary input of the first primary amplifier;
  ii) a coupling of the output of the first primary amplifier to the second input of the first nulling amplifier; and
  iii) a coupling of the output of the second primary amplifier to the first input of the first nulling amplifier.

19. The ping-pong amplifier as in claim 18, wherein the switching network provides at a second time:
 i) a de-coupling of the output of the first nulling amplifier to the first auxiliary input of the first primary amplifier;
 ii) a de-coupling of the output of the first primary amplifier to the second input of the first nulling amplifier; and
 iii) a de-coupling of the output of the second primary amplifier to the first input of the first nulling amplifier.

20. The ping-pong amplifier as in claim 18, wherein the switching network provides at the second time:
 i) a coupling of the output of the second nulling amplifier to the first auxiliary input of the second primary amplifier;
 ii) a coupling of the output of the second primary amplifier to the second input of the second nulling amplifier; and
 iii) a coupling of the output of the first primary amplifier to the first input of the second nulling amplifier.

* * * * *